United States Patent
Mitsunaga

(10) Patent No.: US 9,059,266 B2
(45) Date of Patent: Jun. 16, 2015

(54) SEMICONDUCTOR DEVICE AND MANUFACTURING METHOD OF THE SAME

(71) Applicant: Sony Corporation, Tokyo (JP)

(72) Inventor: Masahiro Mitsunaga, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/860,947

(22) Filed: Apr. 11, 2013

(65) Prior Publication Data

US 2013/0307022 A1    Nov. 21, 2013

(30) Foreign Application Priority Data

May 16, 2012 (JP) ................................ 2012-112033

(51) Int. Cl.
| | |
|---|---|
| H01L 29/66 | (2006.01) |
| H01L 29/778 | (2006.01) |
| H01L 21/28 | (2006.01) |
| H01L 29/10 | (2006.01) |
| H01L 29/205 | (2006.01) |
| H01L 31/101 | (2006.01) |

(52) U.S. Cl.
CPC .............. *H01L 29/778* (2013.01); *H01L 21/28* (2013.01); *H01L 29/66462* (2013.01); *H01L 29/7781* (2013.01); *H01L 29/7785* (2013.01); *H01L 29/1066* (2013.01); *H01L 29/205* (2013.01)

(58) Field of Classification Search
CPC ................ H01L 29/7787; H01L 2924/13064; H01L 2924/1309; H01L 29/263; H01L 29/66464; H01L 29/432; H01L 29/778; H01L 21/28; H01L 29/66462; H01L 29/7781; H01L 29/7785; H01L 29/1066; H01L 29/205
USPC .......... 257/12, 183, 187, 189, 192, 194, 196, 257/E29.246, E21.403, E29.253
See application file for complete search history.

(56) References Cited

U.S. PATENT DOCUMENTS

| | | | | |
|---|---|---|---|---|
| 4,929,985 | A | * | 5/1990 | Takasaki ......................... 257/51 |
| 2004/0164312 | A1 | * | 8/2004 | Biwa et al. ...................... 257/99 |
| 2008/0283870 | A1 | * | 11/2008 | Sato .............................. 257/194 |
| 2010/0213513 | A1 | * | 8/2010 | Zampardi et al. ............. 257/201 |
| 2010/0276732 | A1 | * | 11/2010 | Ando et al. .................... 257/192 |
| 2011/0024798 | A1 | * | 2/2011 | Tamari et al. ................. 257/195 |

OTHER PUBLICATIONS

Yang et al. Investigation of Hole Mobility in GaInP/(In)GaAs/GaAs p-Type Modulation Doped Heterostructure, >Chin. Phys. Lett. vol. 16, No. 1 (1999), pp. 50-52.*
Krispin. Chapter 16; Polarization Charges at Spontaneously Ordered (In,Ga)P/GaAs interfaces, pp. 451-468, from Mascarenhas (ed). Spontaneous Ordering in Semiconductor Alloys, Plenum Publishes, New York, 2002.*

* cited by examiner

*Primary Examiner* — Galina Yushina
(74) *Attorney, Agent, or Firm* — Sony Corporation

(57) ABSTRACT

A semiconductor device includes a buffer layer formed with a semiconductor adapted to produce piezoelectric polarization, and a channel layer stacked on the buffer layer, wherein a two-dimensional hole gas, generated in the channel layer by piezoelectric polarization of the buffer layer, is used as a carrier of the channel layer. On a complementary semiconductor device, the semiconductor device described above and an n-type field effect transistor are formed on the same compound semiconductor substrate. Also, a level shift circuit is manufactured by using the semiconductor device. Further, a semiconductor device manufacturing method includes forming a compound semiconductor base portion, forming a buffer layer on the base portion, forming a channel layer on the buffer layer, forming a gate on the channel layer, and forming a drain and source with the gate therebetween on the channel layer.

14 Claims, 19 Drawing Sheets

F I G . 3
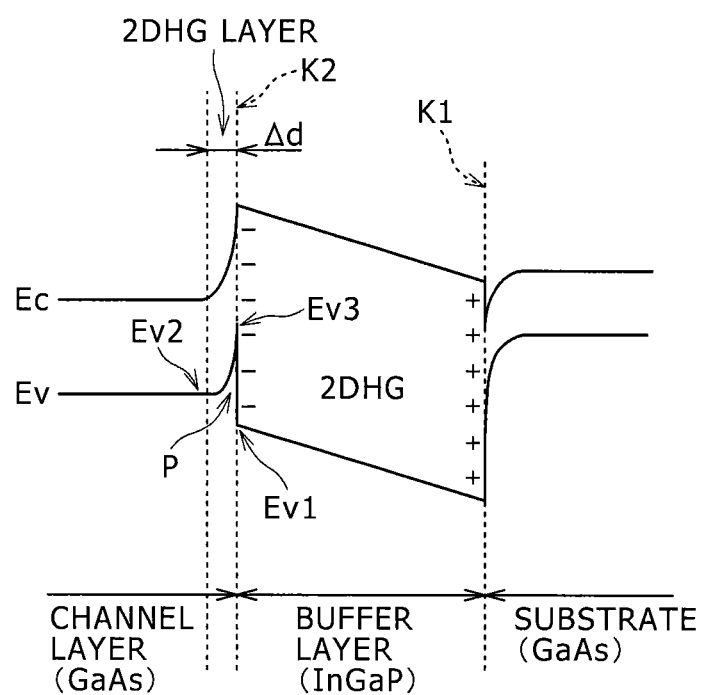

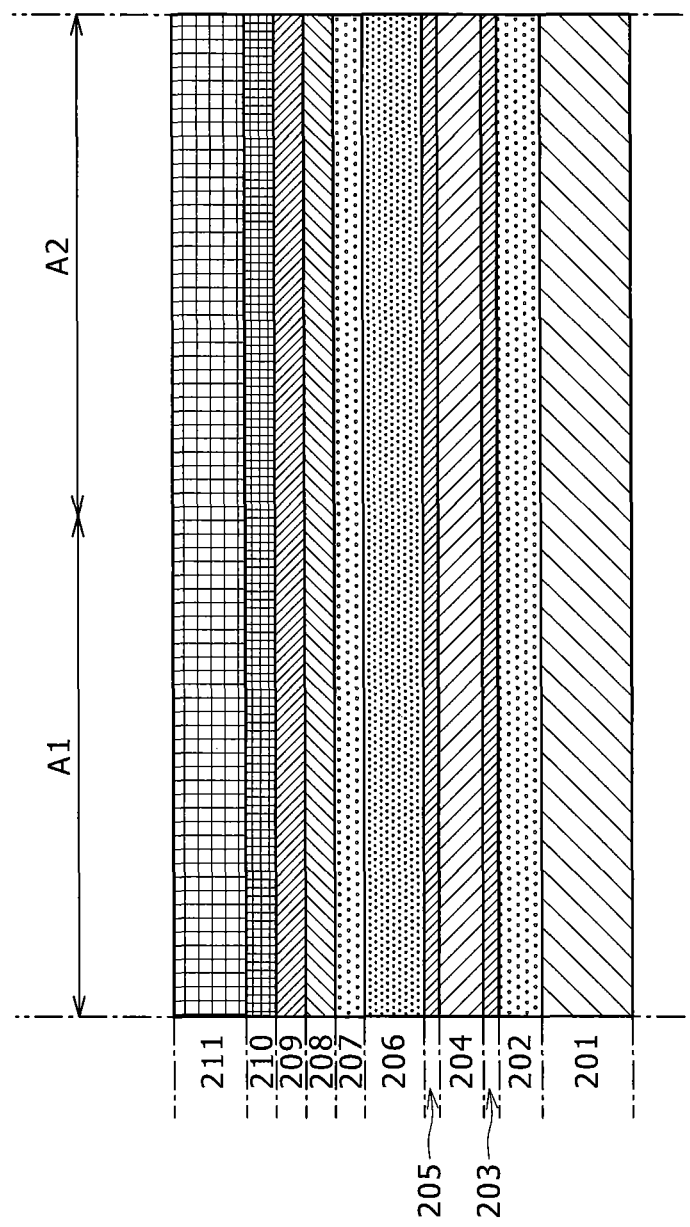

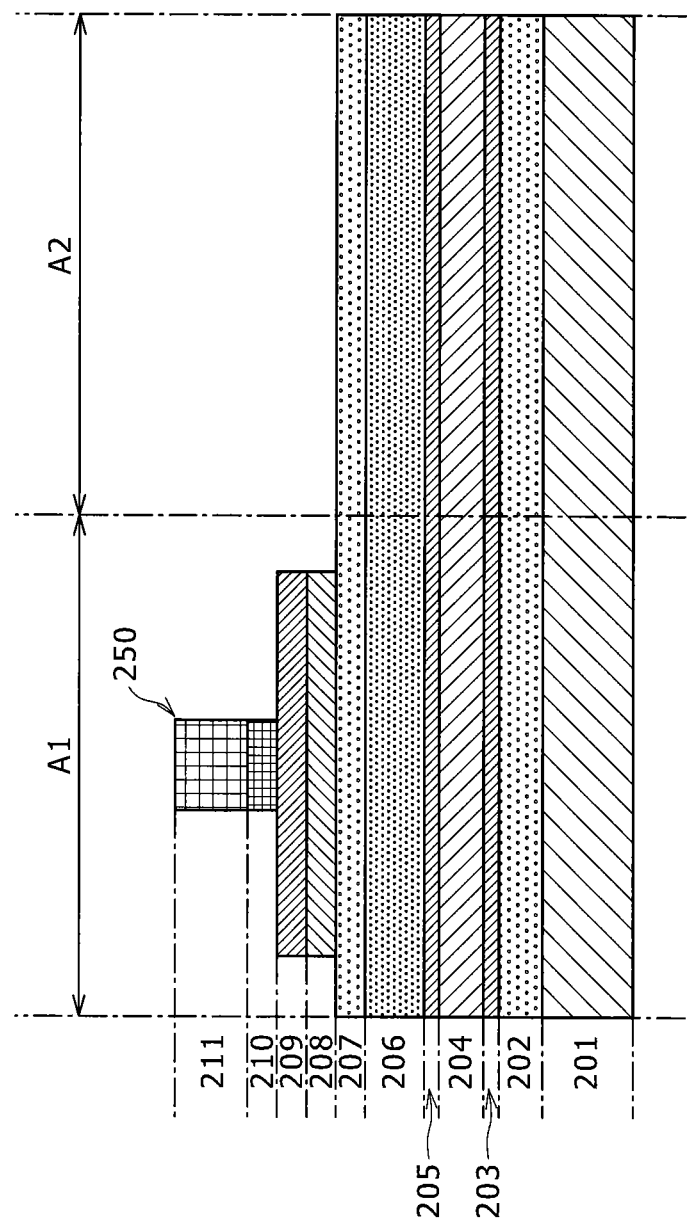

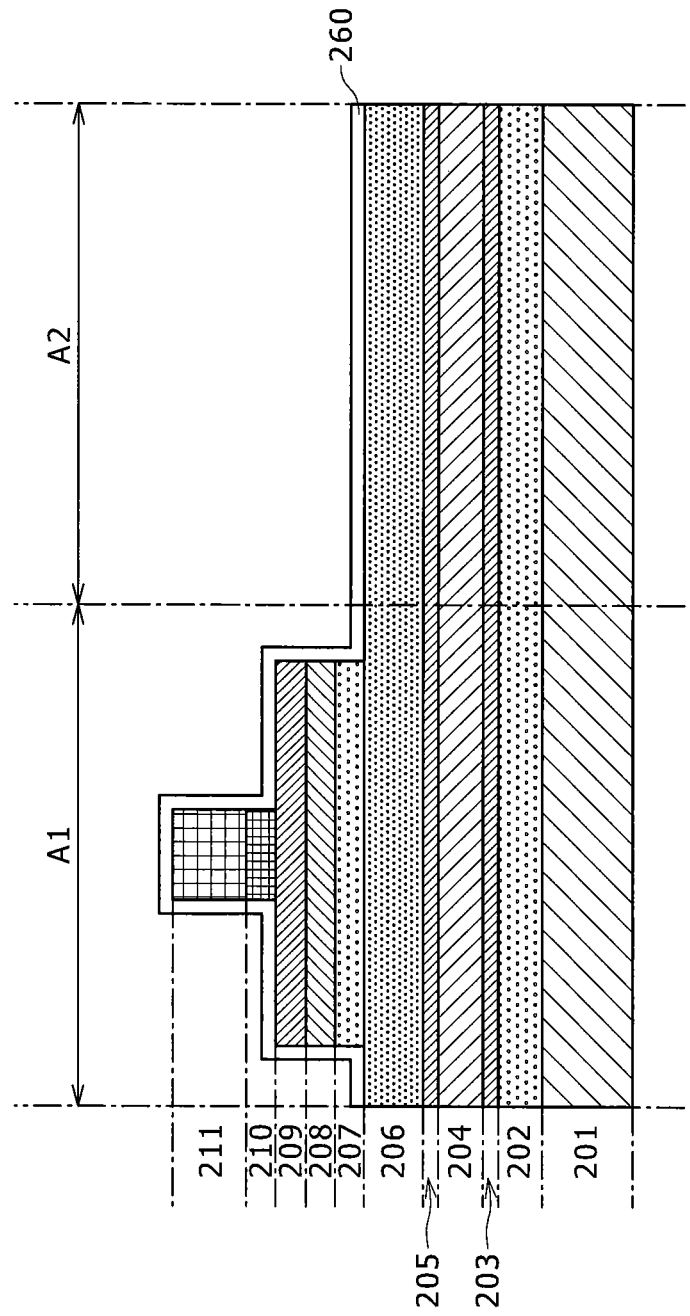

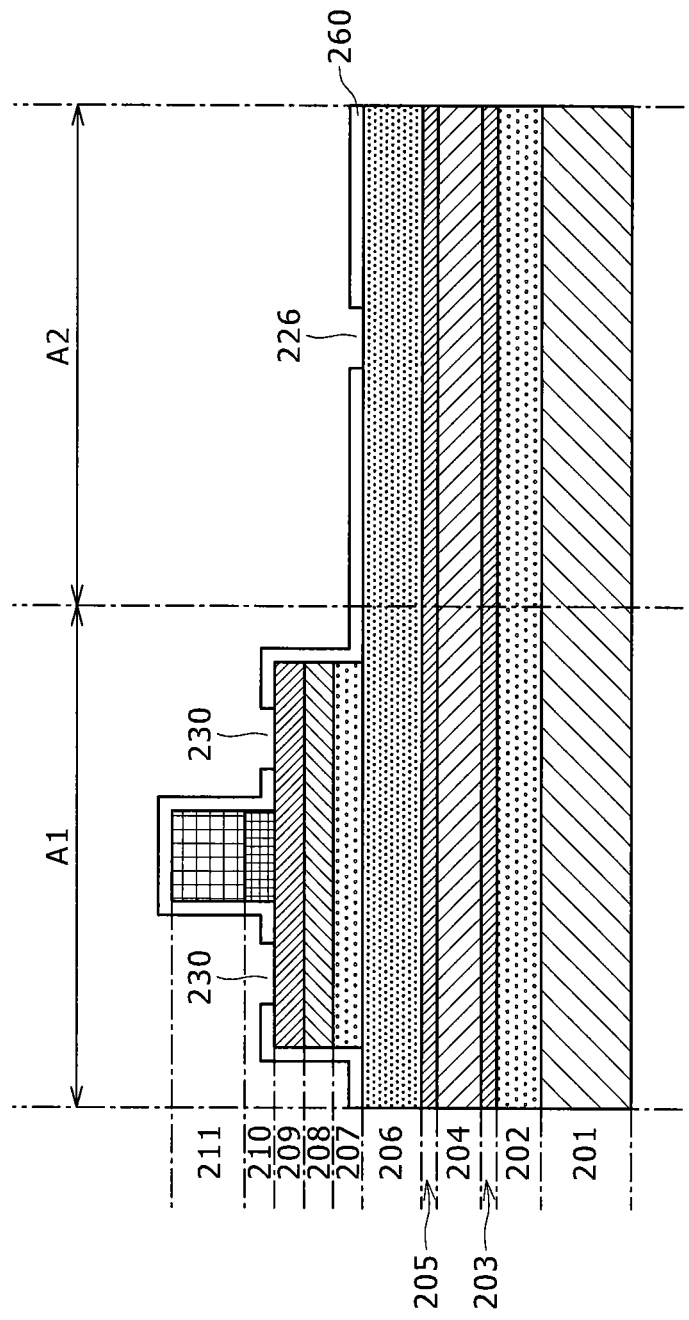

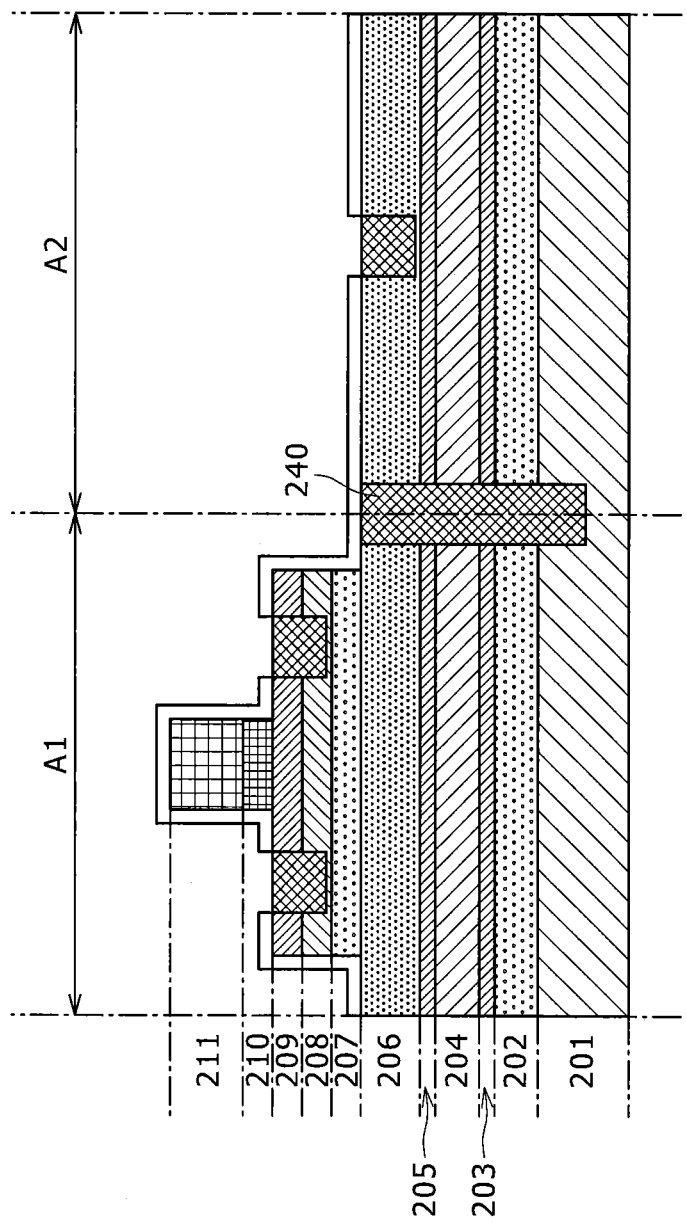

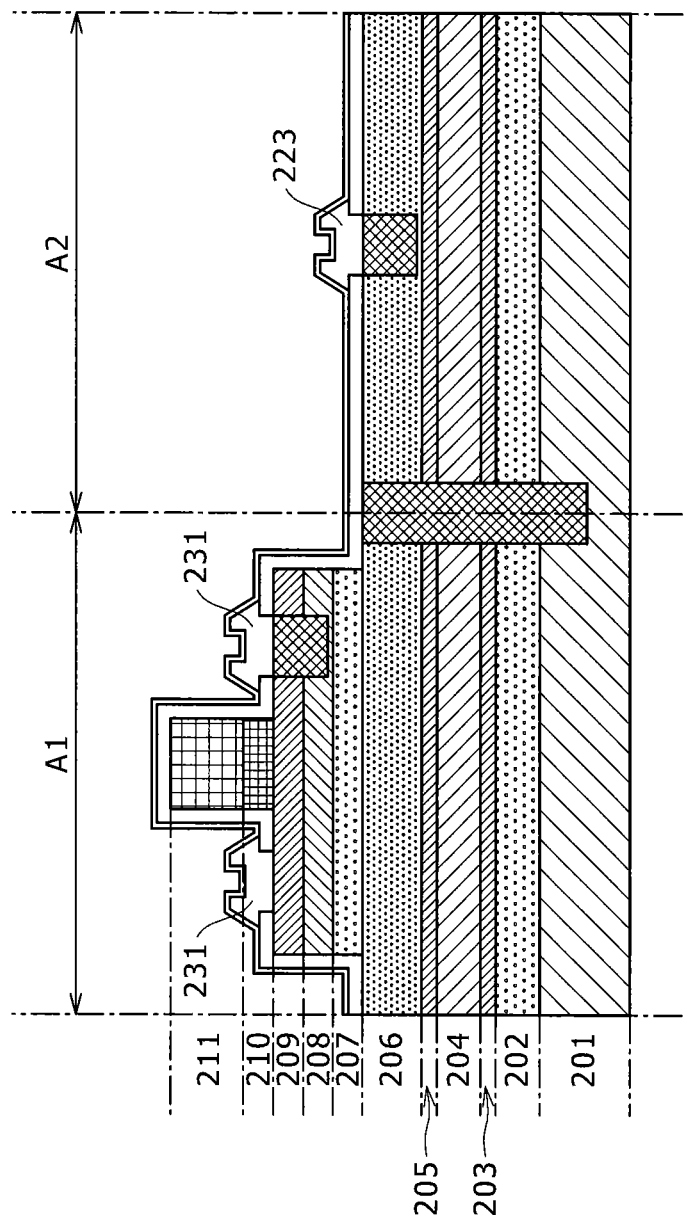

SEMICONDUCTOR DEVICE AND MANUFACTURING METHOD OF THE SAME

BACKGROUND

The present technology relates to using a two-dimensional hole gas, generated in a channel layer by piezoelectric polarization of a buffer layer, as a carrier of the channel layer.

A compound semiconductor-based field effect transistor (FET) having a GaAs-based or other compound semiconductor layer offers high electron mobility, thus providing excellent n-channel frequency characteristics. Among FETs using an n-channel employed for high-frequency bands are HEMT and JPHEMT (refer, for example, to Japanese Patent Laid-Open No. Hei 11-150264). HEMT is an abbreviation for High Electron Mobility Transistor, and JPHEMT an abbreviation for Junction Pseudomorphic High-Electron-Mobility Transistor.

HEMT is an FET using, as a channel, a high-mobility two-dimensional electron gas induced at a semiconductor heterojunction interface. JPHEMT is an FET that provides an electron mobility higher than HEMP by tolerating a certain degree of lattice mismatch. JPHEMT is an FET that offers improved gate forward voltage (turn-on voltage) by using a pn junction as a gate.

Some of such FETs using an n-channel employ, as a carrier, a two-dimensional electron gas produced on the side of an electron travel layer at the heterojunction interface between an electron supply layer and the electron travel layer as a result of piezoelectric polarization and spontaneous polarization between the electron supply layer and electron travel layer (refer, for example, to Japanese Patent Laid-Open No. 2010-074077 and Japanese Patent Laid-Open No. 2010-045343).

SUMMARY

As described above, n-channel FETs are increasing in performance. In addition, the development of complementary elements using compound semiconductor has been requested to achieve a high element integration level. That is, it is necessary to achieve high carrier mobility and low gate on-resistance in a p-channel FET as well.

Here, it is necessary to add an impurity such as C or Zn to a p-channel FET, manufactured by selectively etching an epitaxial substrate formed through epitaxial growth, to supply holes. In general, however, the more the impurity, the lower the carrier mobility. Therefore, it has been difficult to achieve high carrier mobility and low gate on-resistance in a p-channel FET.

The present technology has been devised in light of the foregoing, and it is desirable to provide a semiconductor device and manufacturing method of the same that can achieve high carrier mobility and low gate on-resistance in a p-channel FET, manufactured by selectively etching an epitaxial substrate formed through epitaxial growth, so as to achieve a high element integration level.

A semiconductor device according to an embodiment of the present technology includes a buffer layer and channel layer. The buffer layer is formed with a semiconductor adapted to produce piezoelectric polarization. The channel layer is stacked on the buffer layer. A two-dimensional hole gas, generated in the channel layer by piezoelectric polarization of the buffer layer, is used as a carrier of the channel layer.

It should be noted that the semiconductor device according to another embodiment of the present technology includes a variety of modes such as one implemented in a manner integrated in other device and another implemented in other manner. Further, the present technology can also be achieved as a variety of systems having the semiconductor device, a manufacturing method of the above device, a program adapted to allow a computer to implement the manufacturing method of the above device, a computer-readable recording media recording the program and so on.

The present technology produces high-density carriers at the heterointerface between undoped layers, thus providing improved carrier (hole) mobility. This makes it possible to achieve high carrier concentration, high carrier saturation speed and relatively high breakdown voltage in a semiconductor device using holes as carriers, thus contributing to low on-resistance, high-speed operation and high withstand voltage.

BRIEF DESCRIPTION OF THE DRAWINGS

FIG. 3 is a diagram describing the band structure of the semiconductor device;

FIGS. 12A to 12J are diagrams describing the manufacturing method of the semiconductor device according to the second embodiment.

DETAILED DESCRIPTION OF THE PREFERRED EMBODIMENTS

The present technology will be described below in the following order.

(1) Configuration of the First Embodiment of the Semiconductor Device
(2) Configuration of the Second Embodiment of the Semiconductor Device
(3) Manufacturing Method of the Semiconductor Device According to the Second Embodiment
(4) Conclusion

(1) Configuration of the First Embodiment of the Semiconductor Device

Figure 1:
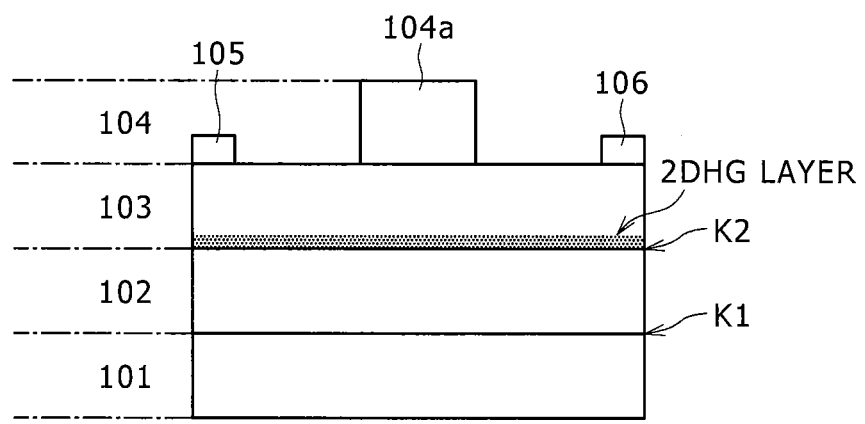
FIG. 1 is a diagram illustrating an example of cross-sectional configuration of a semiconductor device according to a first embodiment.

FIG. 1 is a diagram illustrating an example of cross-sectional configuration of a semiconductor device 100 according to a first embodiment. The semiconductor device 100 shown in FIG. 1 includes a compound semiconductor-based p-channel field effect transistor (hereinafter abbreviated as a pFET).

The pFET serving as the semiconductor device 100 is formed by selectively etching an epitaxial crystal growth layer, formed by epitaxial growth, on a substrate 101 serving as a compound semiconductor substrate manufactured with compound semiconductor GaAs single crystal. The epitaxial crystal growth layer is formed by stacking, from the side of the substrate 101, a buffer layer 102, channel layer 103 and gate layer 104 in this order. A description will be given below of each of the layers.

The buffer layer 102 is formed on the substrate 101 and made of a semiconductor that lattice-matches the substrate 101 at a heterojunction interface K1 during epitaxial growth. Here, the term "lattice match" refers to growth without any misfit dislocations on the junction surface, and may be pseudo-lattice match if a semiconductor layer is formed with a critical film thickness or less before generation of misfit dislocations. As described above, it is possible to form the buffer layer 102 on the substrate 101 by epitaxial growth by providing a lattice match between the substrate 101 and buffer layer 102.

It should be noted that at least one semiconductor layer may be stacked between the buffer layer 102 and substrate 101 which lattice-matches both the semiconductors of the buffer layer 102 and substrate 101 and has a band gap different from those of the semiconductors of the buffer layer 102 and substrate 101. Stacking a semiconductor layer between the buffer layer 102 and substrate 101 as described above provides a larger band gap for improved withstand voltage.

For example, it is possible to stack, for example, GaAlInP quaternary alloy between the buffer layer 102 and substrate 101. GaAlInP has a band gap of 1.9 to 2.3 eV, thus providing improved pFET withstand voltage.

Further, the film thickness of the buffer layer 102 is 10 to 1000 nm, and preferably 250 to 1000 nm. As described above, controlling the film thickness of the buffer layer 102 provides improved FET withstand voltage. It should be noted that the thicker the buffer layer 102, the higher the pFET withstand voltage.

Still further, the buffer layer 102 is formed with a semiconductor that produces piezoelectric polarization when formed on a GaAs substrate. The term "piezoelectric polarization" refers to spontaneous polarization that is macroscopically produced by piezoelectric effect and charge imbalance between positive and negative ions. Piezoelectric effect is attributable to local distortions resulting from the crystal structure. An internal electric field is generated macroscopically in a given direction in the buffer layer 102 due to this piezoelectric polarization.

The internal electric field has at least a vector component in the direction leading from the substrate 101 to the channel layer 103 in the semiconductor device 100 according to the present embodiment. More specifically, this vector component is predominant in the internal electric field vector of the buffer layer 102. As a result, the buffer layer 102 is positively charged at the heterojunction interface K1 with the substrate 101 and negatively charged at a heterojunction interface K2 with the channel layer 103. InGaP is among semiconductors that produce such piezoelectric polarization. It should be noted that InGaP used as the buffer layer 102 may contain an addition of an impurity or no addition at all.

Figure 2:
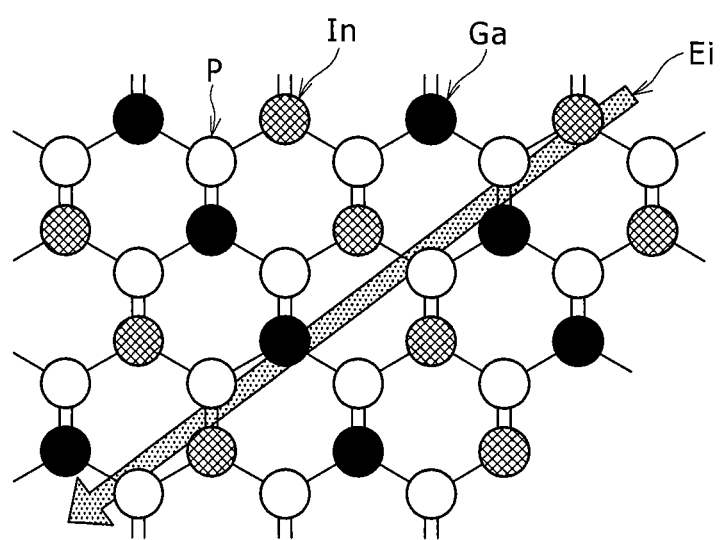
FIG. 2 is a diagram schematically illustrating the crystal structure of a buffer layer.

FIG. 2 is a diagram describing piezoelectric polarization in InGaP epitaxially grown on a GaAs substrate. As illustrated in FIG. 2, when InGaP is epitaxially grown on the (001) crystal plane of the GaAs substrate, a natural superlattice structure is formed in the <111> direction. This InGaP natural superlattice structure has an ordering vector in the <111> direction of the zinc blende structure.

Therefore, the InGaP crystal structure changes from a cubic system to a trigonal system, thus leading to piezoelectric effect and spontaneous polarization. Piezoelectric effect is attributable to local distortions resulting from the difference in bond length between Ga—P and In—P. Spontaneous polarization is attributable to charge imbalance between positive and negative ions. At this time, a macroscopic internal electric field is induced in the <111> direction in the epitaxial crystal growth layer as shown in FIG. 3. That is, an internal electric field Ei running from the substrate 101 to the channel layer 103 is generated in the buffer layer 102.

It should be noted that when InGaP is used as the buffer layer 102, and when the indium (In) composition ratio is represented by the formula $In_xGa_{1-x}P$, $x=0.51$. By adopting this composition ratio, it is possible to produce significant piezoelectric polarization while at the same time achieving a lattice match between InGaP of the buffer layer 102 and GaAS of the substrate 101 and between InGaP of the buffer layer 102 and GaAs of the channel layer which will be described later.

The channel layer 103 is formed on the buffer layer 102. The same layer 103 is a semiconductor layer through which a main pFET current flows. The channel layer 103 is formed with a semiconductor which lattice-matches the buffer layer 102 during epitaxial growth. By providing a lattice match between the buffer layer 102 and channel layer 103 as described above, it is possible to form the channel layer 103 on the buffer layer 102 through epitaxial growth.

Further, the channel layer 103 is formed with a semiconductor that offers a higher energy level of the valence band than the buffer layer 102. Therefore, a potential barrier is formed at the heterojunction interface K2. This barrier restricts the migration of holes from the channel layer 103 to the buffer layer 102.

Still further, the energy level of the valence band at the heterojunction interface K2 is higher than that near the same interface K2 on the side of the buffer layer 102 and that at the same interface K2 on the side of channel layer 103. Therefore, the energy level of the valence band at the heterojunction interface K2 changes discontinuously or steeply, forming, in the valence band at the heterojunction interface K2, an upwardly protruding triangular potential having hole confinement effect.

Here, holes generated in the channel layer 103 are attracted to the heterojunction interface K2 by the internal electric field of the buffer layer 102 described above. However, these holes are confined by the triangular potential formed near the side of the channel layer 103 at the heterojunction interface K2, causing these holes to be quantized. This allows a two-dimensional hole gas layer (2DHG layer) to be formed near the side of the channel layer 103 at the heterojunction interface K2.

The material of the channel layer 103 that meets these conditions when InGaP is used as the buffer layer 102 is a semiconductor that lattice-matches this InGaP. Among examples of such a material are GaAs, InGaAs, AlGaAs, InGaAsP and appropriate combinations thereof. Further, an impurity of $1 \times 10^{17}$ atoms/cm$^3$ or less may be added to the channel layer 103, and the film thickness of the same layer 103 is 30 to 150 nm. More preferably, the film thickness of the same layer 103 is 50 to 100 nm. It is possible to guarantee the enhancement mode operation of the pFET by controlling the film thickness of the channel layer 103 to fall within the above range.

FIG. 3 is a diagram describing the band structure of the semiconductor device 100. In the example shown in FIG. 3, the buffer layer 102 is formed with InGaP to which no impurity has been added, and the channel layer 103 with GaAs to which no impurity has been added. At this time, as far as the energy level of the valence band is concerned, an energy level Ev2 of the channel layer 103 is higher than an energy level Ev1 of the buffer layer 102.

Further, an energy level Ev3 of the valence band at the heterojunction interface K2 between the buffer layer 102 and channel layer 103 is higher than the energy level Ev1 of the valence band of the buffer layer 102 and the energy level Ev2 of the valence band of the channel layer 103. As a result, the energy level of the valence band is discontinuous between the energy levels Ev1 and Ev3 on the side of the buffer layer 102 at the heterojunction interface K2.

On the side of the channel layer 103 at the heterojunction interface K2, on the other hand, the energy level of the valence band changes continuously. However, the energy level drops steeply from Ev3 to Ev2 near the heterojunction interface K2 (within a given distance Δd). As a result, an upwardly protruding triangular potential P adapted to trap holes is formed near the heterojunction interface K2 on the side of the channel layer 103. The higher the energy level of the triangular potential P, the narrower the potential.

Here, the holes generated in the channel layer 103 tend to be attracted to the heterojunction interface K2 by the internal electric field Ei of the buffer layer 102. The holes attracted in this way are trapped by the triangular potential P. Then, the holes trapped by the narrow triangular potential P are quantized, forming a 2DHG layer on the side of the channel layer 103 of the heterojunction interface K2.

Here, the density of the two-dimensional hole gas of the 2DHG layer was $1 \times 10^{17}$ to $1 \times 10^{18}$ atoms/cm$^3$ when InGaP was used as the buffer layer 102 and GaAs as the channel layer, and when the film thickness of the buffer layer was 10 to 1000 nm, and the film thickness of the channel layer 30 to 150 nm. This is equal to or better than that of a HEMT in related art. That is, it is clear that a 2DHG equal to or better than that of a HEMT in related art has been produced without performing modulation doping with an impurity as done for manufacturing a common HEMT structure in related art.

The semiconductor device 100 according to the first embodiment is, for example, free from impact of impurity dispersion caused by impurity diffusion, thus providing a significantly high hole mobility. Therefore, the same device 100 according to the first embodiment provides high carrier concentration, high carrier saturation speed and relatively high breakdown voltage, thus contributing to low on-resistance, high-speed operation and high withstand voltage.

It should be noted that the semiconductor of the channel layer 103 may be doped with C, Zn or Be as an impurity so long as the concentration thereof is $1 \times 10^{17}$ atoms/cm$^3$ or less. Further, the semiconductor of the buffer layer 102 may be doped with C, Zn or Be as an impurity so long as the concentration thereof is $1 \times 10^{12}$ to $4 \times 10^{18}$ atoms/cm$^3$. It is generally known that the concentration of an impurity equal to or greater than $1 \times 10^{17}$ atoms/cm$^3$ leads to a steep decline in mobility of the holes, i.e., carriers. However, an impurity whose concentration falls within the above range provides further enhanced hole concentration without degrading the hole mobility in the channel layer 103.

Further, according to the experiment conducted by the inventor of the present application, the thicker the buffer layer 102, the more two-dimensional holes tend to be generated in the channel layer 103. Therefore, increasing the thickness of the buffer layer 102 provides more carriers generated in the channel layer 103. On the other hand, reducing the thickness of the buffer layer 102 leads to less carriers generated in the channel layer 103. That is, it is possible to adjust the amount of two-dimensional hole gas produced in the channel layer 103 by adjusting the thickness of the buffer layer 102.

Further, the buffer layer 102 may be formed with a plurality of semiconductor layers that are stacked one on top of another with other type of semiconductor layer sandwiched between the INGaP layers. A semiconductor layer formed with a material that has a higher valence electron energy level than InGaP and lattice-matches the InGaP layer is used as a semiconductor layer other than the InGaP layers. Among examples of such a material are GaAs, InGaAs, AlGaAs, InGaAsP and combinations of these materials. It should be noted that if the buffer layer 102 is formed with a plurality of semiconductor layers, an InGaP layer serving as a piezoelectrically polarized semiconductor is used at least as a layer joined to the channel layer 103. This allows a two-dimensional hole gas to be produced by piezoelectric polarization of the buffer layer 102.

On the other hand, if the buffer layer 102 is formed with a plurality of semiconductor layers, a semiconductor layer formed with a material that has a higher valence electron energy level than InGaP and lattice-matches the InGaP layer is used as a semiconductor layer other than the InGaP layers. Forming the buffer layer 102 with a plurality of semiconductor layers provides the same layer 102 with a certain degree of conductivity. For example, the buffer layer 102 formed with an InGaP/GaAs/InGaP layered film offers better conductivity than that formed with an InGaP single layer film.

It should be noted that, according to the experiment conducted by the inventor of the present application, even if the buffer layer 102 had a multilayer structure, the number of carriers generated in the channel layer 103 was proportional to the thickness of the buffer layer 102 as a whole. Therefore, even if the buffer layer 102 has a multilayer structure including semiconductor layers other than the InGaP layers, it is possible to adjust the number of carriers to be produced in the channel layer 103 by adjusting the thickness of the buffer layer 102 as a whole.

A gate portion 104a making up a pFET gate is formed on the channel layer 103, and a drain electrode 105 and source electrode 106 are formed with the gate portion 104a therebetween. Here, the gate portion 104a can be formed by a variety of methods such as a combination of epitaxial growth and selective etching, impurity diffusion, vapor deposition of a schottky metal and vapor deposition of a schottky metal via an oxide film.

Here, letting the leak current of the gate portion manufactured by a combination of epitaxial growth and selective etching be denoted by I1, the leak current of the gate portion manufactured by impurity diffusion by I2, the leak current of the gate portion manufactured by vapor deposition of a schottky metal by I3, and the leak current of the gate portion manufactured by vapor deposition of a schottky metal via an oxide film by I4, the relationship I4<I1=I2<I3 holds. The leak current should preferably be small. Therefore, the gate portion 104a should be ideally manufactured by vapor deposition of a schottky metal via an oxide film. It should be noted, however, that selective etching is practically preferred for a compound semiconductor because of the difficulties involved in forming and controlling an oxide film in a compound semiconductor.

In the example shown in FIG. 1, the gate layer 104 serving as an n-type semiconductor layer for a gate area is formed on the channel layer 103 by epitaxial growth, and the gate portion 104a is formed by selectively etching the gate layer 104.

The gate layer 104 shown in FIG. 1 can be, for example, a GaAs, InGaP or AlGaAs layer or a combination thereof to which an n-type impurity such as Si has been added at a concentration of $1\times10^{17}$ to $1\times10^{19}$ atoms/cm$^3$. If an n-InGaP layer is used as the gate layer 104, x=0.49 in In$_x$Ga$_{1-x}$P. This provides a lattice match between the channel layer 103 and gate layer 104. If an n-AlGaAs layer is used as the gate layer 104, x=0.1 to 0.5 in Al$_x$Ga$_{1-x}$As. This provides reduced leak current in the gate portion 104a. It should be noted that, more preferably, if an n-AlGaAs layer is used as the gate layer 104, x=0.25 in Al$_x$Ga$_{1-x}$As. This provides reduced leak current while at the same time keeping the ratio of Al, a material that becomes readily oxidized, to a minimum.

The film thickness of the gate layer 104 is not specifically limited if the same layer 104 is formed by stacking an InGaP layer and GaAs layer in this order from the side of the channel layer 103. Due to process-related problems, however, it is practical to set the film thickness of the n-InGaP layer used as a stop layer to 10 to 50 nm, and that of the n-GaAs layer to 50 to 200 nm.

Figure 4A:
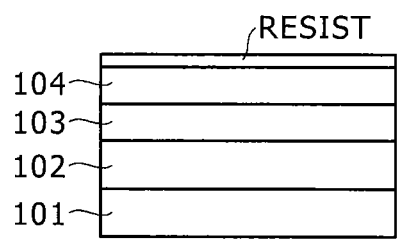
FIGS. 4A to 4E are diagrams describing the manufacturing method of a gate portion relating to FIG. 1.
Figure 4B:
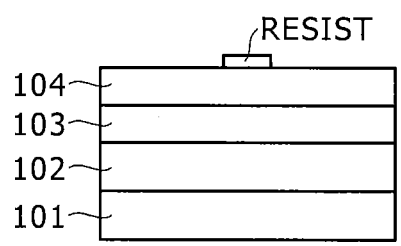
Figure 4C:
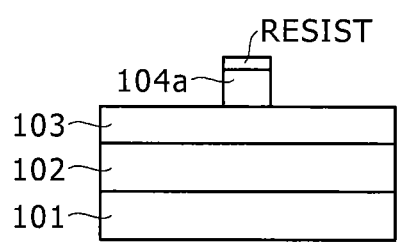
Figure 4D:
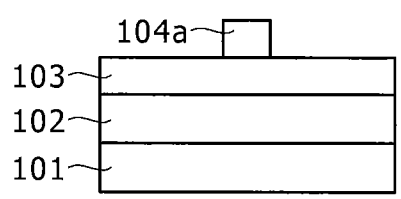

FIGS. 4A to 4E are diagrams describing the manufacturing method of the gate portion 104a of the semiconductor device 100 shown in FIG. 1. In FIG. 4, the gate portion 104a is formed by coating the gate layer with resist (FIG. 4A), followed by making an opening by exposing and developing the resist in the area other than that where the gate portion 104a is to be formed (FIG. 4B), etching the gate layer 104 other than the area where the gate portion 104a is to be formed so as to leave only the gate portion 104a unremoved (FIG. 4C), and peeling off the resist (FIG. 4D).

Figure 4E:
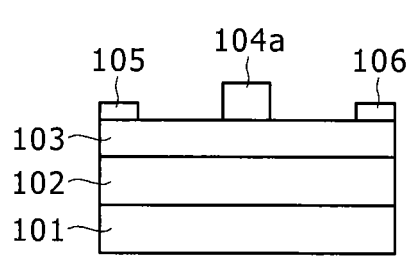

Then, the drain electrode 105 and source electrode 106 are vapor-deposited with the gate portion 104a therebetween in such a manner as to come into ohmic contact with the channel layer 103, thus manufacturing the semiconductor device 100 (FIG. 4E).

Figure 5:
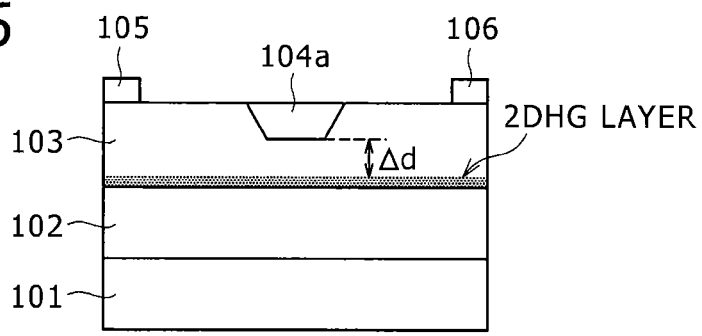
FIG. 5 is a diagram describing the gate portion formed by impurity diffusion.

FIG. 5 illustrates the semiconductor device 100 having the gate portion 104a formed by impurity dispersion. In the semiconductor device 100 shown in FIG. 5, the gate portion 104a is formed with an n-type impurity diffused in the channel layer 103. At this time, the distance between the channel layer 103 and 2DHG layer has been set to 50 to 100 nm by adjusting the impurity diffusion depth. This makes it possible to adjust the pFET threshold voltage, i.e., the current characteristic with respect to the gate voltage. For example, the smaller the distance between the gate portion 104a and 2DHG layer, the easier it is to perform enhancement mode operation, and the larger the distance therebetween, the easier it is to perform depletion mode operation. Further, an n-type impurity used to form the gate portion 104a is, for example, Si, S, Se, Te, Sn or Ge, and the impurity concentration (donor concentration Nd) thereof is $1\times10^{17}$ to $1\times10^{19}$ atoms/cm$^3$.

Figure 6A:
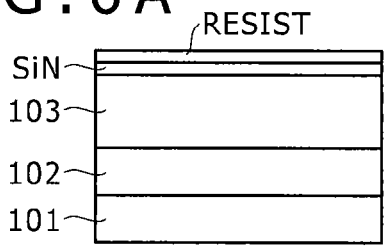
FIGS. 6A to 6F are diagrams describing the manufacturing method of the gate portion relating to FIG. 5.
Figure 6E:
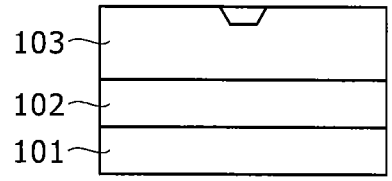
Figure 6B:
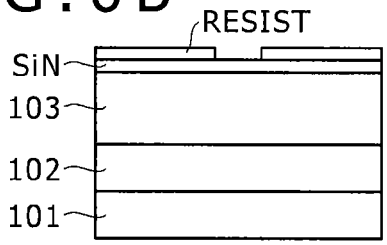

FIGS. 6A to 6F are diagrams describing the manufacturing method of the gate portion 104a of the semiconductor device 100 shown in FIG. 5. In FIG. 6, the gate portion 104a is formed by depositing a SiN film on the channel layer 103 by CVD (chemical vapor deposition) for passivation and coating the SiN film with resist (FIG. 6A), followed by making an opening by exposing and developing the resist in the area for the gate portion 104a (FIG. 6B), making an opening by etching the SiN film in the area for the gate portion 104a with the resist as a mask (FIG. 6C), diffusing the impurity into the channel layer 103 from the opening of the SiN film (FIG. 6D), and peeling off the resist and removing the SiN film (FIG. 6E).

Figure 6F:
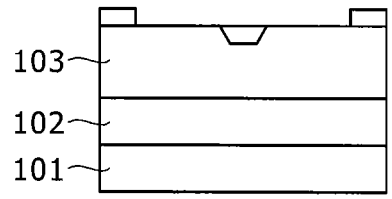
Figure 6C:
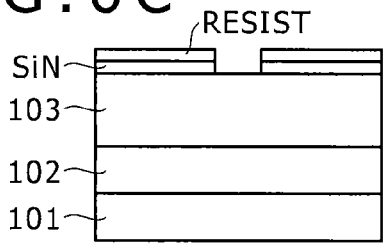
Figure 6D:
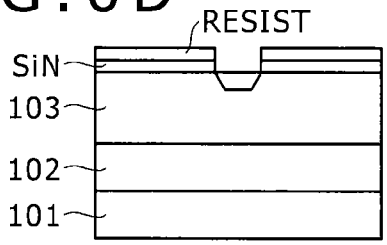

Then, the drain electrode 105 and source electrode 106 are vapor-deposited with the gate portion 104a therebetween in such a manner as to come into ohmic contact with the channel layer 103, thus manufacturing the semiconductor device 100 (FIG. 6F).

Figure 7:
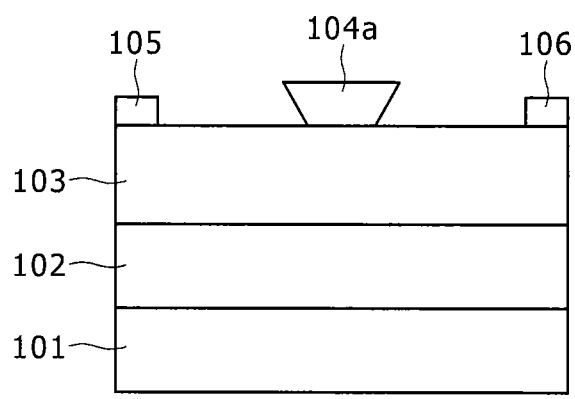
FIG. 7 is a diagram describing the gate portion formed by vapor deposition of a schottky metal.

FIG. 7 illustrates the semiconductor device 100 having the gate portion 104a formed by vapor deposition of a schottky metal. In the semiconductor device 100 shown in FIG. 7, the gate portion 104a is formed by directly schottky-joining a gate electrode to the channel layer 103. The schottky metal used as the gate portion 104a is, for example, Al, Zr, Hf, Gd, Fe, Nd, Sn, Yb, Au, Ti or Ni.

Figure 8A:
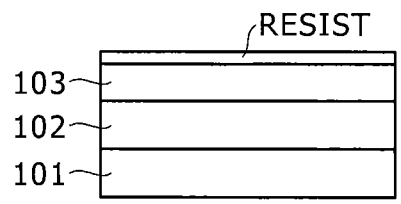
FIGS. 8A to 8E are diagrams describing the manufacturing method of the gate portion relating to FIG. 7.
Figure 8B:
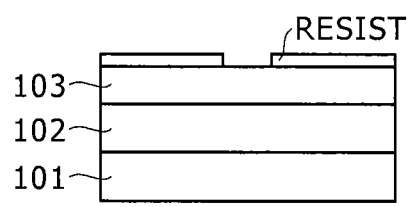
Figure 8C:
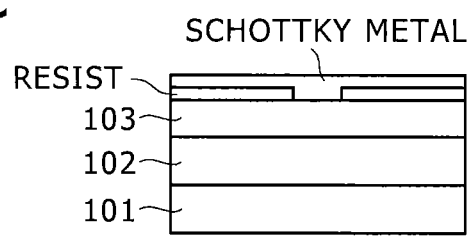
Figure 8D:
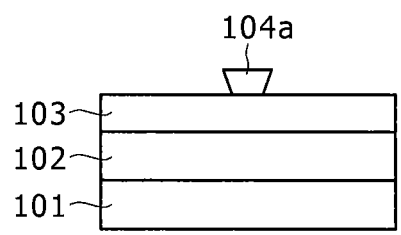

FIGS. 8A to 8E are diagrams describing the manufacturing method of the gate portion 104a of the semiconductor device 100 shown in FIG. 7. In FIG. 8, the gate portion 104a is formed by coating the channel layer 103 with resist (FIG. 8A), followed by making an opening by exposing and developing the resist in the area where the gate portion 104a is to be formed (FIG. 8B), vapor-depositing a schottky metal thereon (FIG. 8C), and lifting off the schottky metal vapor-deposited in the area other than the gate area by peeling off the resist (FIG. 8D).

Figure 8E:
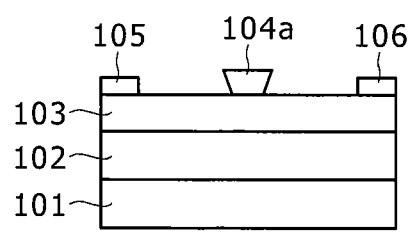

Then, the drain electrode 105 and source electrode 106 are vapor-deposited with the gate portion 104a therebetween in such a manner as to come into ohmic contact with the channel layer 103, thus manufacturing the semiconductor device 100 (FIG. 8E).

Figure 9:
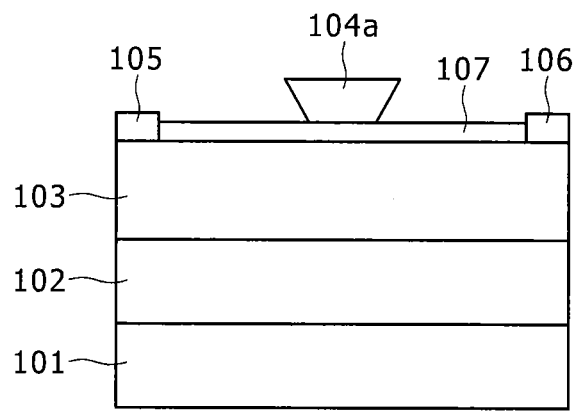
FIG. 9 is a diagram describing the gate portion formed by vapor deposition of the schottky metal via an oxide film.

FIG. 9 illustrates the semiconductor device 100 having the gate portion 104a formed by vapor deposition of a schottky metal via an oxide film. In the semiconductor device 100 shown in FIG. 9, the gate portion 104a is formed by vapor-depositing a schottky metal on an insulating film that is deposited on the channel layer 103. An oxide film such as Al$_2$O$_3$, HfO, Ga$_2$O or GaON is formed to the thickness of 10 to 30 nm for use as the insulating film. On the other hand, the schottky metal used as the gate portion 104a is, for example, Al, Zr, Hf, Gd, Fe, Nd, Sn, Yb, Au, Ti or Ni.

Figure 10A:
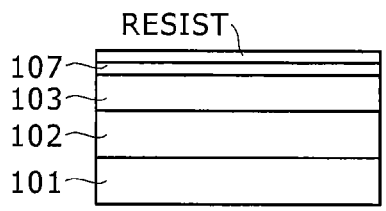
FIGS. 10A to 10F are diagrams describing the manufacturing method of the gate portion relating to FIG. 9.
Figure 10F:
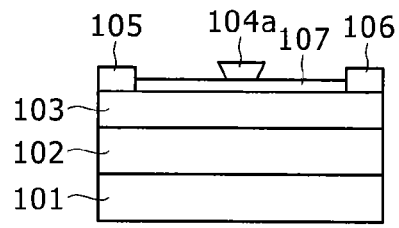
Figure 10B:
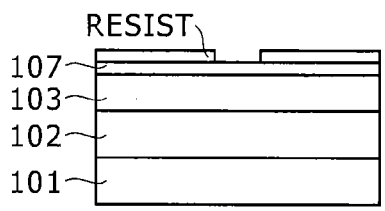
Figure 10C:
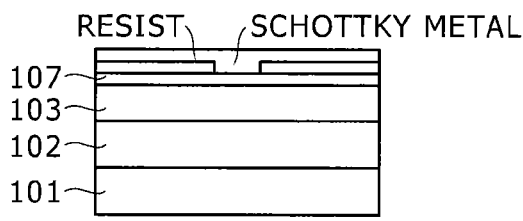
Figure 10D:
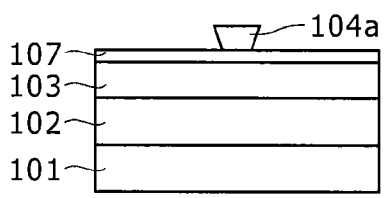
Figure 10E:
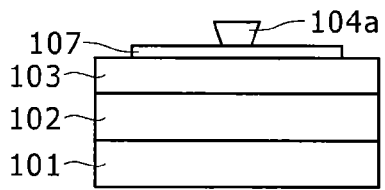

FIGS. 10A to 10F are diagrams describing the manufacturing method of the gate portion 104a of the semiconductor device 100 shown in FIG. 9. In FIGS. 10A to 10F, the gate portion 104a is formed by depositing an insulating film on the channel layer 103, followed by coating the insulating film with resist (FIG. 10A), making an opening by exposing and developing only the resist in the gate area (FIG. 10B), vapor-depositing a schottky metal thereon (FIG. 10C), and lifting off the schottky metal vapor-deposited in the area other than the gate area by peeling off the resist (FIG. 10D).

Then, the areas, on both sides of the gate portion 104a, are etched until the channel layer 103 is reached (FIG. 10E), followed by vapor-depositing the drain electrode 105 and source electrode 106 respectively in the openings formed by etching in such a manner as to come into ohmic contact with the channel layer 103, thus manufacturing the semiconductor device 100 (FIG. 10F).

The gate portion 104a of the semiconductor device 100 according to the present embodiment can be manufactured by a variety of methods as described above, thus allowing formation of the same portion 104a by the method best suited for the intended purpose.

(2) Configuration of the Second Embodiment of the Semiconductor Device

A description will be given next of another embodiment using the above pFET. Among suitable embodiments using the above pFET are complementary inverter and level shift logic. In a second embodiment described below, a description will be given by taking, as an example, a case in which the above pFET is used as a complementary inverter.

Figure 11:
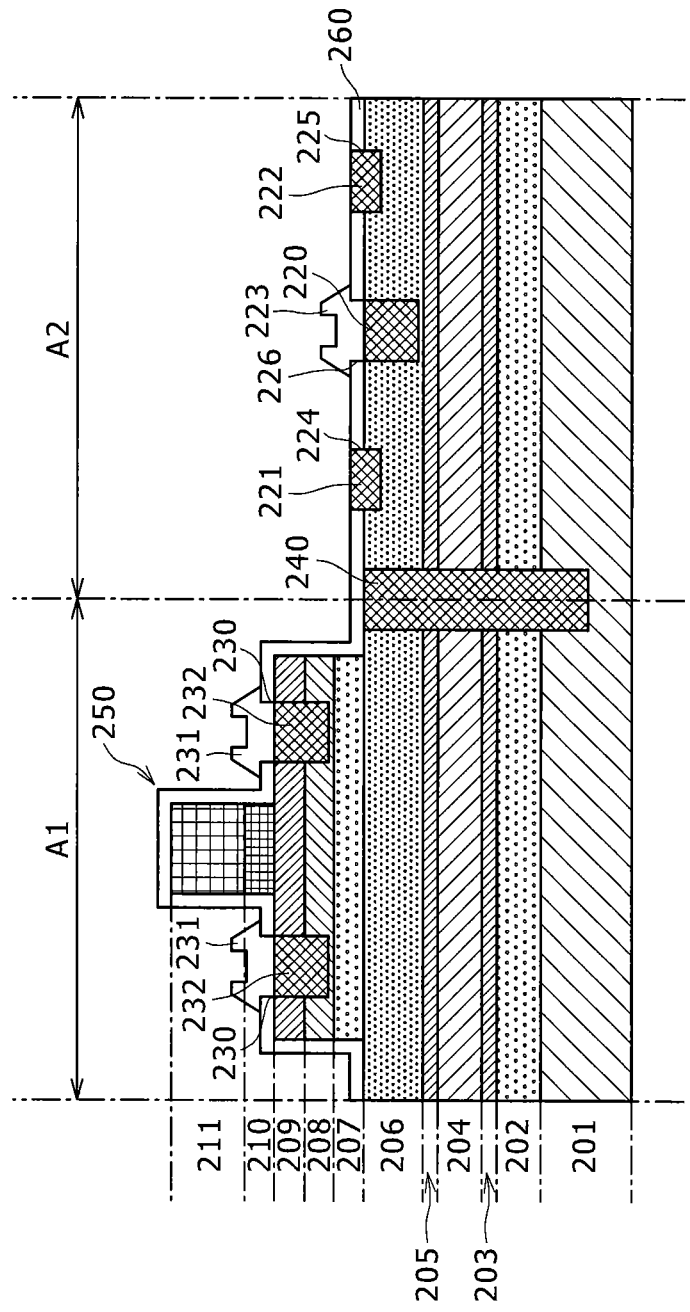
FIG. 11 is a diagram illustrating an example of cross-sectional configuration of the semiconductor device according to a second embodiment.

FIG. 11 is a diagram illustrating an example of cross-sectional configuration of a semiconductor device 200 according to the second embodiment. The semiconductor device 200 shown in FIG. 11 is a complementary inverter having a compound semiconductor-based pFET and n-channel field effect transistor (hereinafter referred to as an nFET) formed on the same substrate. The pFET used for this complementary inverter corresponds to the pFET according to the first embodiment. The pFET according to the second embodiment which will be descried below permits substitution or combination of the features of the pFET according to the first embodiment as appropriate.

In the semiconductor device 200 according to the second embodiment, layers 202 to 205, i.e., epitaxial layers adapted to form an n-channel field effect transistor (nFET), and layers 206 to 211, i.e., epitaxial layers adapted to form a p-channel field effect transistor (pFET), are formed in this order on a compound semiconductor substrate 201, i.e., a GaAs single crystal substrate, by epitaxial growth.

The semiconductor device 200 has two areas, a first area A1 in which the pFET is formed, and a second area A2 in which the nFET is formed. The first and second areas A1 and A2 are formed on the same single compound semiconductor substrate by processing (e.g., etching and doping) an epitaxial substrate in a proper sequence. The epitaxial substrate is layered and formed on the compound semiconductor substrate 201 by epitaxial growth.

Both the first and second areas A1 and A2 have an epitaxial crystal growth layer for forming the nFET. This epitaxial crystal growth layer includes the first buffer layer 202, first barrier layer 203, first channel layer 204 and second barrier layer 205 in this order from the side of the compound semiconductor substrate 201 as illustrated in FIG. 11. It should be noted that either the first barrier layer 203 or second barrier layer 205 may be omitted as necessary.

The first buffer layer 202 is a semiconductor layer inserted between the compound semiconductor substrate 201 and first barrier layer 203 to buffer the difference in lattice constant between the two layers. The same layer 202 is, for example, an AlGaAs layer to which a p-type impurity has been added. It should be noted that the first buffer layer 202 may be an undoped GaAs layer, and a variety of materials can be used as the same layer 202 so long as they can buffer the difference in lattice constant between the compound semiconductor substrate 201 and first barrier layer 203.

The first barrier layer 203 is formed, for example, by stacking a first carrier supply layer 203a and first high resistance layer 203b in this order from the side of the compound semiconductor substrate 201.

The first carrier supply layer 203a is a semiconductor layer adapted to supply electrons, i.e., carriers, to the first channel layer 204. The same layer 203a is, for example, an AlGaAs layer of approximately 3 nm in thickness to which a high concentration of Si, i.e., an n-type impurity, of $1.0 \times 10^{12}$ to $4.0 \times 10^{18}$ atoms/cm$^3$ has been added.

The high resistance layer 203b is a semiconductor layer formed to provide an excellent heterojunction interface between the first carrier supply layer 203a and first channel layer 204. The same layer 203b is, for example, an AlGaAs layer of approximately 3 nm in thickness to which no impurity has been added.

The first channel layer 204 is a semiconductor layer through which a main nFET current flows. The same layer 204 is, for example, an InGaAs layer of 5 to 15 nm in thickness to which no impurity has been added.

The second barrier layer 205 is formed, for example, by stacking a second high resistance layer 205a and second carrier supply layer 205b in this order from the side of the compound semiconductor substrate 201.

The second high resistance layer 205a is a semiconductor layer formed to provide an excellent heterojunction interface between the first channel layer 204 and the second carrier supply layer 205b that is formed on the second high resistance layer 205a. The same layer 205a is, for example, an AlGaAs layer of approximately 3 nm in thickness to which no impurity has been added.

The second carrier supply layer 205b is a semiconductor layer adapted to supply electrons, i.e., carriers, to the first channel layer 204. The same layer 205b is, for example, an AlGaAs layer of approximately 6 nm in thickness to which a high concentration of Si, i.e., an n-type impurity, of $1.0 \times 10^{12}$ to $4.0 \times 10^{18}$ atoms/cm$^3$ has been added.

The schottky layer 206 is a semiconductor layer adapted to form an excellent heterojunction interface between the same layer 206 and a second buffer layer 207 formed on the schottky layer 206. The same layer 206 is, for example, an AlGaAs layer of 70 to 200 nm in thickness to which a low concentration of Si, i.e., an n-type impurity, of $1.0 \times 10^{10}$ to $5.0 \times 10^{17}$ atoms/cm$^3$ has been added.

In the second area A2, the schottky layer 206 has a p-type gate area 220 in which Zn, i.e., a p-type impurity, has been diffused. An insulating film 260 made of a silicon nitride film is formed on the top surface of the schottky layer 206 in the second area A2. An opening 226 is formed in the insulating film 260 to connect a device external to the semiconductor device 200 and the schottky layer 206, with a gate electrode 223 formed in the opening 226.

The gate electrode 223 includes a metal electrode formed by stacking, for example, titanium (Ti), platinum (Pt) and gold (Au) in this order. An ohmic contact is established between the gate electrode 223 and the p-type gate area 220 formed thereunder. A source electrode 221 and drain electrode 222 are formed with the gate electrode 223 therebetween. The source electrode 221 and drain electrode 222 penetrate the insulating film 260, thus establishing an ohmic contact with the schottky layer 206.

Next, as for the first area A1 in which the pFET is formed, a second buffer layer 207, second channel layer 208, gate leak prevention layer 209, n-type first gate layer 210 and n-type second gate layer 211 are provided in the order of the hierarchical structure of layers used for the second area A2.

The second buffer layer 207 is a semiconductor layer inserted between the schottky layer 206 and second channel layer 208 to buffer the difference in lattice constant between the two layers. The same layer 207 is, for example, an InGaP layer of 10 to 1000 nm in thickness to which no impurity has been added. It should be noted that an impurity may be added to the second buffer layer 207.

The second channel layer 208 is a semiconductor layer through which a main pFET current flows. The same layer 208 is formed on the second buffer layer 207 and is, for example, a GaAs, InGaAs, AlGaAs or InGaAsP layer or a combination thereof of 30 to 150 nm in thickness to which no impurity has been added. Of course, in addition to these materials above, a variety of materials can be used as the second channel layer 208 as with the channel layer 103 in the first embodiment described above so long as they lattice-match the second buffer layer 207 and have a higher energy level of the valence band than the second buffer layer 207.

The gate leak prevention layer 209 is a semiconductor layer formed between the second channel layer 208 and n-type gate layer and adapted to prevent gate leak current. The same layer 209 is, for example, an AlGaAs layer of 0 to 50 nm in thickness to which no impurity has been added. It should be noted that the gate leak prevention layer 209 may be omitted as necessary.

An n-type gate area 250 is formed on the gate leak prevention layer 209. The same area 250 is narrower than the layers 207 to 209 that are formed on the hierarchical structure of the layers 202 to 206 in the first area A1. The same area 250 has a two-layer structure made up of the n-type first gate layer 210 and n-type second gate layer 211 stacked in this order from the side of the compound semiconductor substrate 201.

The n-type first gate layer 210 is, for example, an InGaP layer of 10 to 50 nm in thickness to which an n-type impurity such as Si has been added at a concentration of $1\times10^{17}$ to $5\times10^{19}$ atoms/cm$^3$.

The n-type second gate layer 211 is, for example, an GaAs layer of 50 to 200 nm in thickness to which an n-type impurity such as Si has been added at a concentration of $1\times10^{17}$ to $5\times10^{19}$ atoms/cm$^3$.

An insulating film 260 made of a silicon nitride film is formed on the side surfaces of the second buffer layer 207, second channel layer 208, gate leak prevention layer 209 and n-type gate layers and on the top surfaces of the gate leak prevention layer 209 and n-type gate layers.

In the insulating film 260 formed on the top surface of the gate leak prevention layer 209, openings 230 are formed with the n-type gate layers therebetween and at a distance from these layers that are stacked on the gate leak prevention layer 209. Source and drain electrodes 231 made of a metal are formed in the openings 230.

Each of the source and drain electrodes 231 includes a metal electrode formed by stacking, for example, titanium (Ti), platinum (Pt) and gold (Au) in this order. An ohmic contact is established between the source and drain electrodes 231 and source and drain areas 232 formed thereunder, respectively.

The source and drain areas 232 are diffusion areas formed by diffusing Zn, i.e., an impurity, into the gate leak prevention layer 209 from the openings 230 and transforming part of the gate leak prevention layer 209 and second channel layer 208 into p-type areas. That is, the source and drain areas 232 are formed in such a manner as to penetrate the gate leak prevention layer 209 and extend to part of the second channel layer 208.

It should be noted that an element isolation area 240 is formed in the boundary area between the first and second areas A1 and A2 to penetrate the layers 201 to 206. The element isolation area 240 is formed, for example, by implanting B (boron) ions.

As described above, a pFET having a pn junction gate is formed in the first area A1, and an nFET having a pn junction gate in the second area A2. This allows formation of complementary FETs on the same substrate. Both of these complementary FETs, and the pFET, in particular, can be operated in enhancement mode and offer reduced leak current, thus contributing to high-speed operation.

Figure 12B:
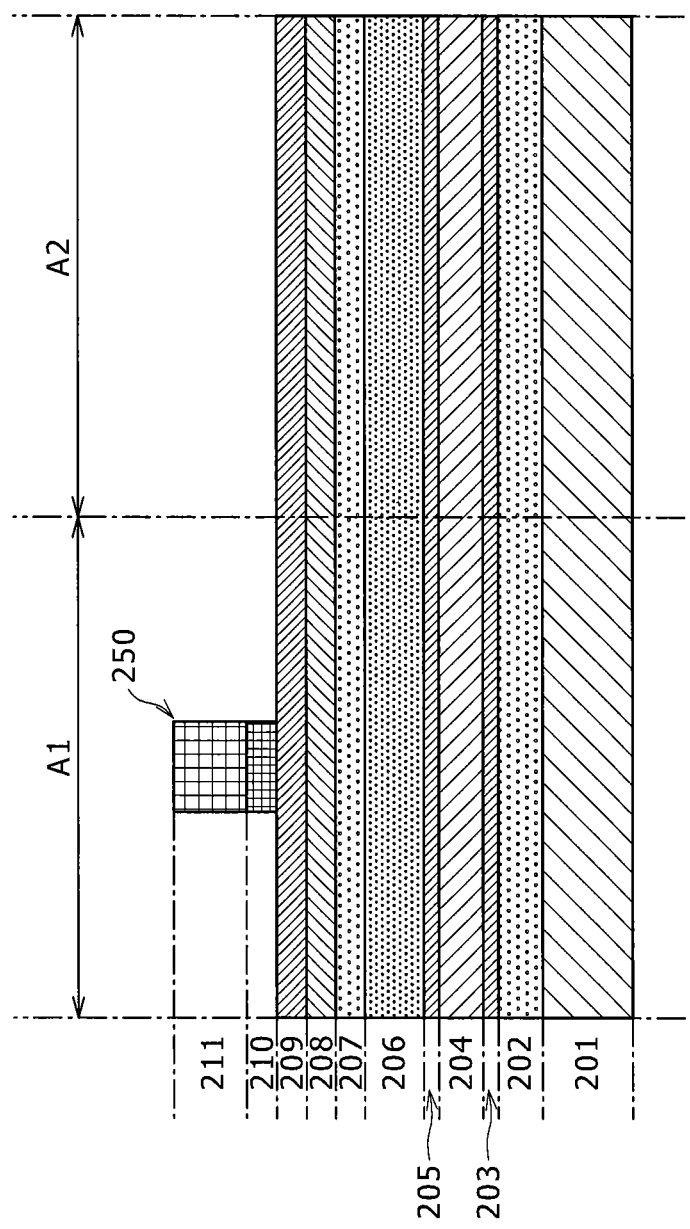

(3) Manufacturing Method of the Semiconductor Device According to the Second Embodiment A description will be given next of the manufacturing method of the semiconductor device 100 according to the second embodiment with reference to FIGS. 12A to 12J. FIG. 12A is a vertical cross-sectional view illustrating the layered structure of the semiconductor device 100 formed by epitaxially growing each of the layers made primarily of GaAs materials on a GaAs single crystal substrate, for example, by metal organic chemical vapor deposition (MOCVD).

In order to form the layered structure shown in FIG. 12A, a GaAs layer to which no impurity has been added is epitaxially grown on the compound semiconductor substrate 201 made of GaAs single crystal, thus forming the first buffer layer 202 of approximately 200 nm in thickness.

Next, an AlGaAs layer to which a high concentration of Si, i.e., an n-type impurity, of $1.0\times10^{12}$ to $4.0\times10^{12}$ atoms/cm$^3$, and, for example, $3.0\times10^{12}$ atoms/cm$^3$, has been added is epitaxially grown on the first buffer layer 202, thus forming the first carrier supply layer 203a of approximately 3 nm in thickness.

Next, an AlGaAs layer to which no impurity has been added is epitaxially grown on the first carrier supply layer 203a, thus forming the first high resistance layer 203b of approximately 3 nm in thickness. The first carrier supply layer 203a and first high resistance layer 203b make up the first barrier layer 203. The aluminum (Al) composition ratio of the first barrier layer 203 represented by the formula $Al_{1-x}Ga_xAs$, is, for example, $Al_{0.2}Ga_{0.8}As$ by setting x=0.1 to 0.5.

Next, an InGaAs layer to which no impurity has been added is epitaxially grown on the first high resistance layer 203, thus forming the first channel layer 204 of 5 to 15 nm in thickness. By setting x=0.51, the indium (In) composition ratio of the first channel layer 204 represented by the formula $In_{1-x}Ga_xAs$ provides a narrower band gap than for the first barrier layer described above.

Next, an AlGaAs layer to which no impurity has been added is epitaxially grown on the first channel layer 204, thus forming the second high resistance layer 205a of approximately 2 nm in thickness.

Next, an AlGaAs layer to which a high concentration of Si, i.e., an n-type impurity, of $1.0\times10^{12}$ to $4.0\times10^{12}$ atoms/cm$^3$ has been added is epitaxially grown on the second high resistance layer 205a, thus forming the second carrier supply layer 205b of approximately 6 nm in thickness.

The second high resistance layer 205a and second carrier supply layer 205b make up the second barrier layer 205. The aluminum (Al) composition ratio of the second barrier layer 205 represented by the formula $Al_{1-x}Ga_xAs$ is, for example, $Al_{0.2}Ga_{0.8}As$ by setting x=0.1 to 0.5. This provides the second barrier layer with a wider band gap than that of the first channel layer 204.

Next, an AlGaAs layer to which a low concentration of Si, i.e., an n-type impurity, has been added, is epitaxially grown on the second carrier supply layer 205b, thus forming the schottky layer 206 of 70 to 200 nm in thickness.

Next, an InGaP layer to which no impurity has been added is epitaxially grown, thus forming the second buffer layer 207 of 10 to 1000 nm in thickness.

Next, a GaAs layer to which no impurity has been added is epitaxially grown on the second buffer layer 207, thus forming the second channel layer 208 of 30 to 150 nm in thickness.

Next, an AlGaAs layer to which no impurity has been added is epitaxially grown on the second channel layer 208, thus forming the gate leak prevention layer 209 of 0 to 50 nm in thickness. A "0" thickness is given because the gate leak prevention layer 209 is not typically necessary. The aluminum (Al) composition ratio of the gate leak prevention layer 209 represented by the formula $Al_{1-x}Ga_xAs$ is, for example, Al0.2Ga0.8As by setting x=0.1 to 0.5.

Next, an InGaP layer to which an n-type impurity such as Si has been added at a concentration of $1\times10^{17}$ to $5\times10^{19}$ atoms/cm$^3$ is epitaxially grown on the gate leak prevention layer 209 or second channel layer 208, thus forming the n-type first gate layer 210 of 10 to 50 nm in thickness.

Next, a GaAs layer to which an n-type impurity such as Si has been added at a concentration of $1\times10^{17}$ to $5\times10^{19}$ atoms/cm$^3$ is epitaxially grown on the n-type first gate layer 210, thus forming the n-type second gate layer 211 of 50 to 200 nm in thickness. The n-type first gate layer 210 and n-type second gate layer 211 make up the n-type gate layer. It should be noted that the epitaxial growth described above is conducted at a temperature of approximately 600° C.

Next, as illustrated in FIG. 12B, the n-type second gate layer 211 and n-type first gate layer 210 are selectively removed in this order, for example, by photolithography technique and wet or dry etching technique. This etching forms the n-type gate area 250 in the first area A1.

Next, as illustrated in FIG. 12C, the gate leak prevention layer 209 and second channel layer 208 are selectively removed in this order, for example, by photolithography technique and wet or dry etching technique. At this time, the InGaP second buffer layer 207 serves as an etching stop layer, thus minimizing the overetching of the second area A2. This prevents the etching from affecting the on-resistance and off-capacitance of the nFET.

Figure 12D:
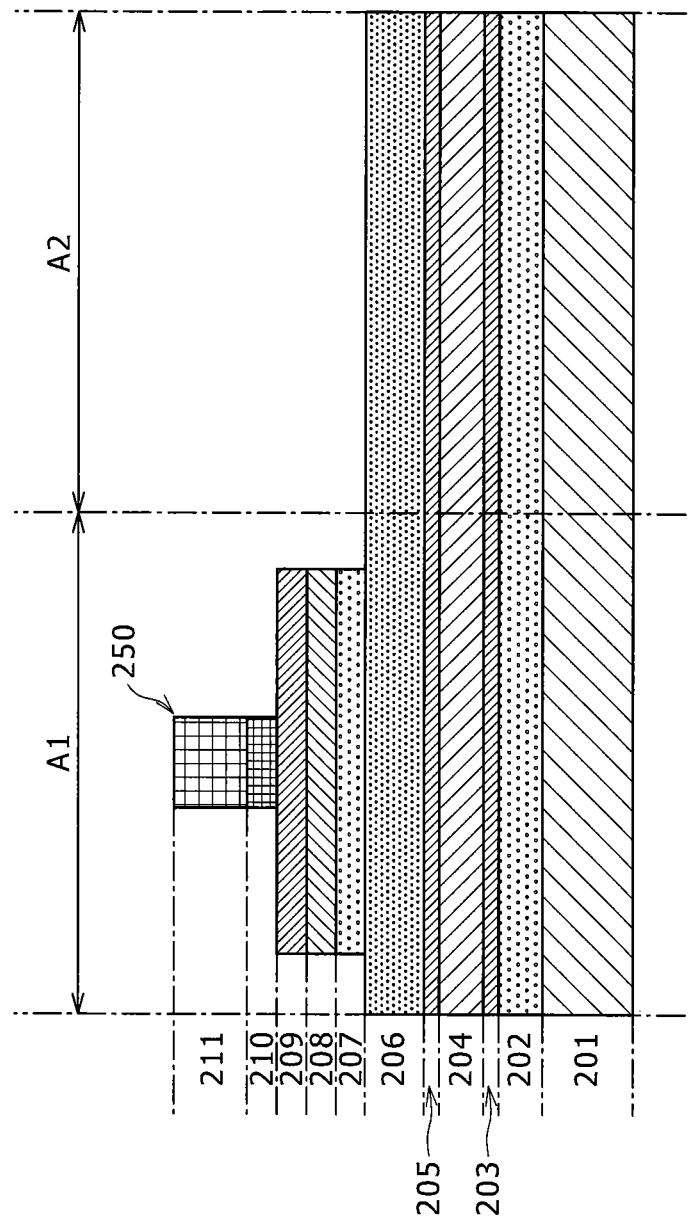

Then, as illustrated in FIG. 12D, the second buffer layer 207 is selectively etched using, for example, hydrochloric acid. As a result of these etching steps, the n-type gate area 250 is stacked on or above the layers 207 to 209 that are left unremoved in the first area A1, with the layers 207 to 211 all removed by etching in the second area A2.

Next, as illustrated in FIG. 12E, the insulating film 260 made of a silicon nitride film is formed to a thickness of 100 to 500 nm on the exposed surface of the substrate by plasma CVD.

Next, as illustrated in FIG. 12F, the openings 230 are formed in the insulating film 260 to form the source and drain areas in the first area A1, and an opening 224 is also formed in the insulating film 260 to form the gate area in the second area A2. The openings 230 and 226 are formed by photolithography technique and anisotropic etching based, for example, RIE (Reactive Ion Etching) technique.

Figure 12G:
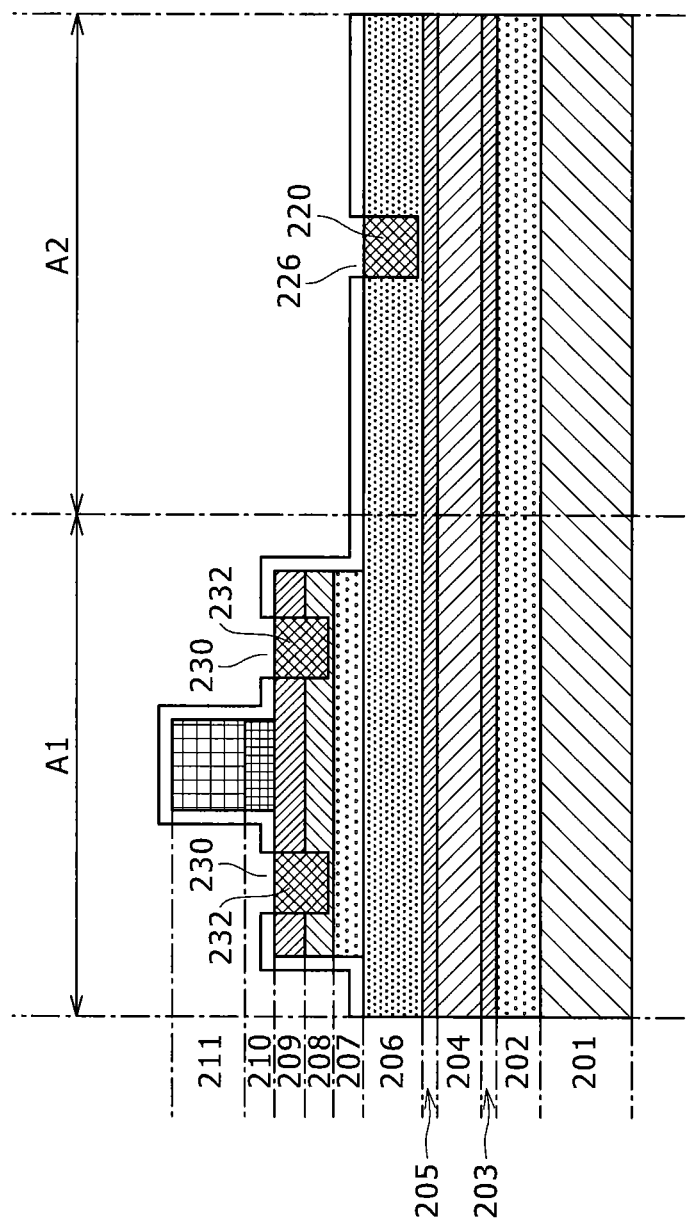

Next, as illustrated in FIG. 12G, Zn, i.e., an impurity, is diffused all the way through the gate leak prevention layer 209 and halfway through the second channel layer 208 in the thickness direction via the openings 230 of the insulating film 260. Zn is also diffused halfway through the schottky layer 206 in the thickness direction via the opening 226. Zn is introduced and diffused through the openings 230 and 226 by heating the substrate at a temperature of approximately 600° C. in a gaseous atmosphere containing diethyl zinc (Zn $(C_2H_5)_2$) and arsine ($AsH_3$). This allows the p-type source and drain areas 232 to be formed in the first area A1 and the p-type gate area 220 to be formed in the second area A2.

It should be noted that the depth of Zn diffusion through the opening 226 in the second area A2 should preferably be approximately 10 nm or more away from the top surface of the first channel layer 204. Alternatively, Zn may be injected by ion implantation.

Next, as illustrated in FIG. 12H, the element isolation area 240 is formed to electrically isolate the first and second areas A1 and A2 from each other. The same area 240 is formed from the schottky layer 206 to a depth reaching the bottom of the first carrier supply layer 203a. The element isolation area 240 can be formed, for example, by implanting B ions.

Figure 12I:
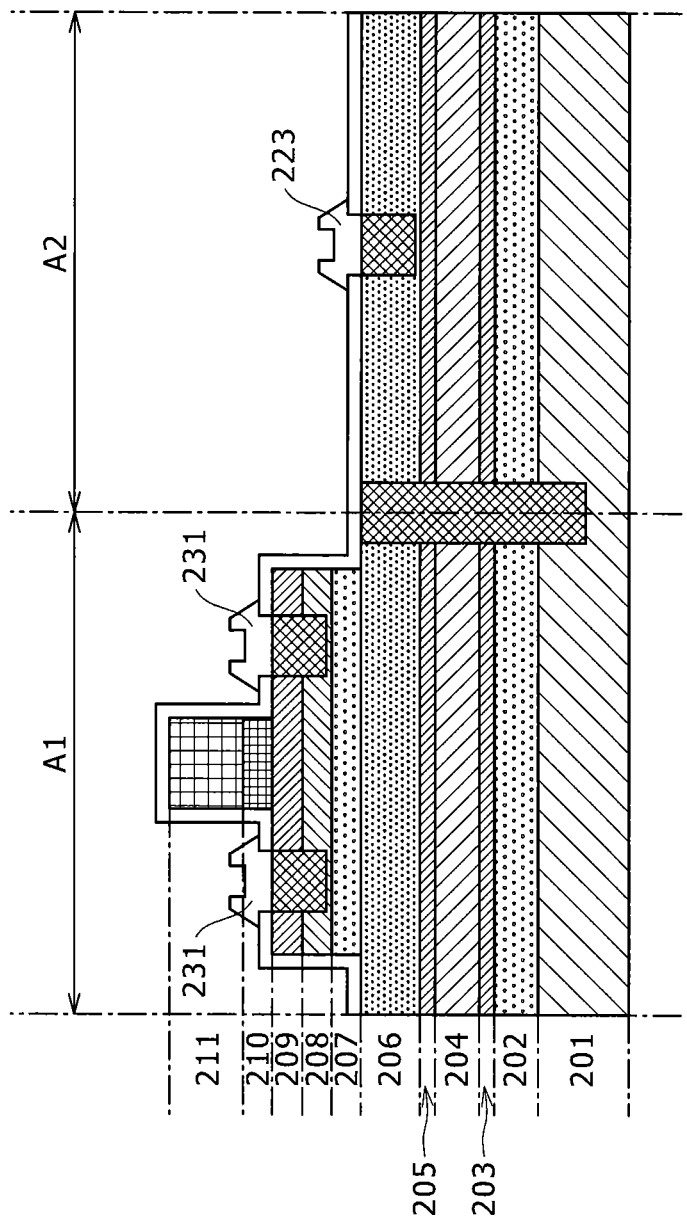

Next, as illustrated in FIG. 12I, a metal film is deposited on the substrate surface, followed by selective removal thereof by photolithography and etching techniques, thus forming the source and drain electrodes 231 in the first area A1 and the gate electrode 223 in the second area A2 at the same time.

The metal film is formed by depositing titanium (Ti), platinum (Pt) and gold (Au) respectively to thicknesses of 30 nm, 50 nm and 120 nm, for example, by electron beam vapor deposition. This allows an ohmic contact to be established between the p-type source and drain areas 232 and the p-type gate area 220 into which Zn has been diffused.

Further, as illustrated in FIG. 12J, a protective film 265 made of an insulating material is deposited on the substrate surface, followed by formation of the opening 224 and an opening 225 in the protective film 265 and insulating film 260 in such a manner as to sandwich the gate electrode 223 in the second area A2.

Then, gold-germanium (AuGe) alloy and nickel (Ni) are deposited to thicknesses of approximately 160 nm and 40 nm respectively on the substrate surface by resistance heating, followed by selective removal thereof by photolithography and etching techniques, thus forming the source electrode 221 and drain electrode 222. An ohmic contact is established between the same electrodes 221 and 222 and the n-type schottky layer 206.

It should be noted that when the openings 224 and 225 are formed in the protective film 265 and insulating film 260, an opening may be formed at the top of the n-type gate area 250 in the first area A1 at the same time, thus allowing the source and drain electrodes 221 and 222 and the gate electrode to be formed in the second area A2 at the same time.

The manufacturing method described above permits manufacture of a complementary inverter by allowing formation of the pFET and nFET whose structures are shown in FIG. 11 on the same substrate at the same time.

(4) Conclusion

The semiconductor device described above includes the buffer layer 102 and channel layer 103. The buffer layer 102 is formed with a semiconductor adapted to produce piezoelectric polarization. The channel layer 103 is stacked on the buffer layer 102. A two-dimensional hole gas, generated in the channel layer 103 by piezoelectric polarization of the buffer layer 102, is used as a carrier of the channel layer 103. This provides high carrier mobility and low gate on-resistance in a p-channel FET manufactured by selectively etching an epitaxial substrate, thus contributing to a high element integration level.

It should be noted that the present technology is not limited to the above embodiments and modification example but includes configurations resulting from mutual substitution or altered combination of the configurations disclosed in the above embodiments and modification example, those resulting from mutual substitution or altered combination of well-known technologies and the configurations disclosed in the above embodiments and modification example and so on. Further, the technical scope of the present technology is not limited to the above embodiments but is applied to the features set forth in the scope of the appended claims, and equivalents thereof.

Still further, the present technology may have the following configurations.

(1) A semiconductor device including:
a buffer layer formed with a semiconductor adapted to produce piezoelectric polarization; and
a channel layer stacked on the buffer layer, in which
a two-dimensional hole gas, generated in the channel layer by piezoelectric polarization of the buffer layer, is used as a carrier of the channel layer.

(2) The semiconductor device of feature (1), in which
the semiconductor adapted to produce piezoelectric polarization in the buffer layer is InGaP.

(3) The semiconductor device of feature (1) or (2), in which
the channel layer is formed with a semiconductor having a higher energy level of the valence band than the buffer layer.

(4) The semiconductor device of any one of features (1) to (3), in which a two-dimensional hole gas is generated in the channel layer by the piezoelectric polarization in an amount proportional to the thickness of the buffer layer.

(5) The semiconductor device of any one of features (1) to (4), in which the buffer layer is formed with a plurality of semiconductor layers that lattice-match each other, in which of the plurality of semiconductor layers, the layer provided adjacent to the channel layer is formed with a semiconductor adapted to produce piezoelectric polarization.

(6) The semiconductor device of any one of features (1) to (5), in which the channel layer is formed by stacking a semiconductor that lattice-matches the semiconductor adapted to produce piezoelectric polarization at least once.

(7) The semiconductor device of any one of features (1) to (6), in which the semiconductor of the channel layer is doped with an impurity at a concentration of $1\times10^{17}$ atoms/cm$^3$ or less, and in which the semiconductor of the buffer layer is doped with an impurity.

(8) The semiconductor device of any one of features (1) to (7), in which the buffer layer is stacked on a compound semiconductor substrate, in which at least one semiconductor layer is stacked between the buffer layer and compound semiconductor substrate, and the semiconductor layer lattice-matches both the semiconductors of the buffer layer and compound semiconductor substrate and has a band gap different from those of the semiconductors of the buffer layer and compound semiconductor substrate.

(9) The semiconductor device of any one of features (1) to (8) including:

a gate formed with an n-type semiconductor stacked on the channel layer.

(10) The semiconductor device of any one of features (1) to (8) including:

a gate formed by diffusing an n-type impurity into the channel layer.

(11) The semiconductor device of any one of features (1) to (8) including:

a gate formed with a schottky metal joined to the channel layer.

(12) The semiconductor device of any one of features (1) to (8) including:

a gate formed by joining a schottky metal to a gate oxide film stacked on the channel layer.

(13) A complementary semiconductor device on which the semiconductor device of any one of features (1) to (12) and an n-type field effect transistor are formed on the same compound semiconductor substrate.

(14) A level shift circuit manufactured by using the semiconductor device of any one of features (1) to (12).

(15) A semiconductor device manufacturing method including:

forming a compound semiconductor base portion;

forming, on the base portion, a buffer layer by stacking a semiconductor that lattice-matches the compound semiconductor of the base portion and produces piezoelectric polarization;

forming, on the buffer layer, a channel layer by stacking a semiconductor that lattice-matches the semiconductor of the buffer layer and produces a two-dimensional hole gas by piezoelectric polarization;

forming a gate on the channel layer; and forming a drain and source with the gate therebetween on the channel layer.

The present disclosure contains subject matter related to that disclosed in Japanese Priority Patent Application JP 2012-112033 filed in the Japan Patent Office on May 16, 2012, the entire content of which is hereby incorporated by reference.

What is claimed is:

1. A semiconductor device comprising:

an undoped buffer layer formed with an indium gallium phosphide (InGaP) semiconductor adapted to produce piezoelectric polarization; and a channel layer stacked on the undoped buffer layer, wherein a two-dimensional hole gas, generated in the channel layer by the piezoelectric polarization of the undoped buffer layer, is used as a carrier of the channel layer.

2. The semiconductor device of claim 1, wherein the channel layer is formed with a semiconductor having a higher energy level of the valence band than the undoped buffer layer.

3. The semiconductor device of claim 1, wherein the two-dimensional hole gas is generated in the channel layer by the piezoelectric polarization in an amount proportional to a thickness of the undoped buffer layer.

4. The semiconductor device of claim 1, wherein the undoped buffer layer is formed with a plurality of semiconductor layers, wherein each layer of the plurality of semiconductor layers lattice-matches an adjacent layer of the plurality of semiconductor layers, and a layer of the plurality of semiconductor layers provided adjacent to the channel layer is formed with the InGaP semiconductor adapted to produce the piezoelectric polarization.

5. The semiconductor device of claim 1, wherein the channel layer is formed by stacking a semiconductor that lattice-matches the InGaP semiconductor adapted to produce the piezoelectric polarization.

6. The semiconductor device of claim 1, wherein a semiconductor of the channel layer is doped with C, Zn or Be as an impurity at a concentration of $1\times10^{17}$ atoms/cm$^3$ or less.

7. The semiconductor device of claim 1, wherein the undoped buffer layer is stacked on a compound semiconductor substrate, and at least one semiconductor layer is stacked between the undoped buffer layer and compound semiconductor substrate, and the at least one semiconductor layer lattice-matches semiconductors of both the undoped buffer layer and the compound semiconductor substrate and has a band gap different from those of the semiconductors of both the undoped buffer layer and the compound semiconductor substrate.

8. The semiconductor device of claim 1 comprising: a gate formed with an n-type semiconductor stacked on the channel layer.

9. The semiconductor device of claim 1 comprising: a gate formed by diffusing an n-type impurity into the channel layer.

10. The semiconductor device of claim 1 comprising: a gate formed with a schottky metal joined to the channel layer.

11. The semiconductor device of claim 1 comprising: a gate formed by joining a schottky metal to a gate oxide film stacked on the channel layer.

12. A circuit manufactured using a semiconductor device including:

an undoped buffer layer formed with an indium gallium phosphide (InGaP) semiconductor adapted to produce piezoelectric polarization; and a channel layer stacked on the undoped buffer layer, wherein a two-dimensional hole gas, generated in the channel layer by piezoelectric polarization of the undoped buffer layer, is used as a carrier of the channel layer.

13. A semiconductor device comprising:

an undoped buffer layer formed with a semiconductor adapted to produce piezoelectric polarization, wherein the semiconductor is $In_{0.51}Ga_{0.49}P$; and a channel layer stacked on the undoped buffer layer, wherein a two-dimensional hole gas, generated in the channel layer by the piezoelectric polarization of the undoped buffer layer, is used as a carrier of the channel layer.

14. A semiconductor device comprising:

an undoped buffer layer formed with an indium gallium phosphide (InGaP) semiconductor adapted to produce piezoelectric polarization; and a channel layer stacked on the undoped buffer layer, wherein the channel layer has a thickness in a range of 30 to 150 nm, wherein a two-dimensional hole gas, generated in the channel layer by the piezoelectric polarization of the undoped buffer layer, is used as a carrier of the channel layer.

* * * * *